United States Patent
Byskov et al.

(10) Patent No.: US 7,025,262 B2
(45) Date of Patent: Apr. 11, 2006

(54) COMPONENT CONTROL IN A PLACEMENT MACHINE

(75) Inventors: Kurt Byskov, Aarhus (DK); Aksel Joergensen, Aarhus (DK); Soeren Cramer, Aarhus (DK)

(73) Assignee: Valor Denmark A/S, Aarhus C (DK)

( * ) Notice: Subject to any disclaimer, the term of this patent is extended or adjusted under 35 U.S.C. 154(b) by 0 days.

(21) Appl. No.: 10/475,612

(22) PCT Filed: Apr. 20, 2002

(86) PCT No.: PCT/DK02/00258

§ 371 (c)(1),
(2), (4) Date: Jul. 19, 2004

(87) PCT Pub. No.: WO02/087303

PCT Pub. Date: Oct. 31, 2002

(65) Prior Publication Data

US 2004/0232216 A1 Nov. 25, 2004

(30) Foreign Application Priority Data

Apr. 23, 2001 (EP) .................................. 011098563

(51) Int. Cl.
*G06F 19/00* (2006.01)

(52) U.S. Cl. ........................ 235/385; 235/375; 235/494; 29/709

(58) Field of Classification Search ................ 235/385, 235/375; 700/114, 116, 121, 150
See application file for complete search history.

(56) References Cited

U.S. PATENT DOCUMENTS

| | | | |
|---|---|---|---|
| 5,325,305 A * | 6/1994 | Rezaei ....................... | 700/114 |
| 5,515,600 A | 5/1996 | Iwasaki et al. | |
| 5,553,376 A | 9/1996 | Solanki et al. | |
| 5,930,140 A * | 7/1999 | Asai et al. ................. | 700/121 |
| 6,027,019 A | 2/2000 | Kou | |
| 6,675,056 B1 * | 1/2004 | Black et al. ................ | 700/116 |
| 2003/0225547 A1 * | 12/2003 | Paradies ..................... | 702/150 |

* cited by examiner

*Primary Examiner*—Daniel Stoyr
*Assistant Examiner*—Daniel A. Hess
(74) *Attorney, Agent, or Firm*—David S. Safran

(57) ABSTRACT

Method for component verification during operation of a placement machine having a series of feeder slots for holding component feeders with feeder markers. For verification, whether the right component has been picked up, it is necessary to determine the ID of the actual slot. The method according to the invention determines the actual slot ID from the sequence list of the placement machine.

22 Claims, 6 Drawing Sheets though the discrepancy has been made by the operator. The slot ID is not available in the configuration information that is typically available to the control system from outside the placement machine. Otherwise, if information about the actual slot ID had been available in the configuration information, reading of the slot markers would not be necessary.

COMPONENT CONTROL IN A PLACEMENT MACHINE

BACKGROUND OF THE INVENTION

1. Field of the Invention

The present invention relates to a method for component verification during operation of a placement machine having a series of feeder slots for holding component feeders with feeder markers, each feeder marker associated with a component ID indicative of the type of component contained in the corresponding feeder, wherein each feeder slot has a slot ID, wherein said placement machine operates in correlation with a repeated sequence list with sequential steps, by which, upon receipt of a pick up trigger signal a feeder marker is scanned from the actual feeder in said actual feeder slot, while the machine is in progress of picking a component from said actual feeder, to determine the actual component ID associated with the feeder marker, the actual slot ID is determined, the intended component ID determined from stored configuration information, where the intended component ID is the ID of the type of component intended to be picked up from said actual feeder slot, the intended component ID is compared with the actual component ID and any discrepancy between the intended component ID and the actual component ID being indicated.

2. Description of Related Art

For electronic board assembly, automated component placement can reach very high speed up to tens of thousands of surface mounts of components per hour. These components are typically supplied by component vendors as rolled tapes of components that are loaded onto individual feeders which are mounted in corresponding feeder slots on the machine. These rolls of components may be loaded onto the feeders at a special loading unit, for example a stock room, after which the loaded feeders are placed in the feeder slots.

Component placement machines can have more than 100 feeder slots each accessible by a picking mechanism that picks individual components from the feeders in the slots and places them in particular predetermined locations on a printed circuit board. For application flexibility, each feeder and slot is generally constructed to be compatible with many different components.

The physical arrangement of components, feeders and slots must be in accordance with the expected arrangement as programmed in the machine. Any error in the arrangement can cause a corresponding error in the placement of components on the board. In a high volume, low mix manufacturing environment, a component loading error can produce a high number of defective printed circuit boards in a short period of time. In a low volume, high mix environment the chance of component loading error increases because of frequent feeder manipulation for product change over.

In order to eliminate loading errors, it is known to place bar code labels on individual feeders and slots for manual scanning to control that the rights components indeed are placed in the right slots according to predetermined configuration information, the so called a device list, which contains a listing of the slots and the components that are expected in the different slots. This procedure is carried out, before the machine begins its operation.

A different control system has been disclosed in U.S. Pat. No. 6,027,019. In this system, two scanners are adapted to monitor the arrangement of slot markers and feeder markers in the machine while the machine is in operation. The read slot marker and feeder marker are then compared with data in a device list.

In known machines, as for example indicated in U.S. Pat. No. 6,027,019, slot markers are far away from the corresponding feeder marker, which is due to constructional reasons. Therefore, two scanners are used and not just one single scanner that is able to scan both markers simultaneously.

In a production environment, those scanners may be exposed to dirt that may cover the reading unit resulting in an unsatisfactory control. Furthermore, the scanners are subject to risk of damage during machine maintenance or service. Therefore, it may be desirable to reduce the number of necessary scanners. Especially the slot scanner is subject to this risk in known machines.

Furthermore, a scanning of both the slot marker and the feeder marker implies that the component has to be picked up always at the same position, typically the central position, with respect to the slot. However, for some components, it is an advantage to pick up the component near to the edge of the feeder. This implies no problem for the feeder scanner, as the feeder marker may be at the pick up position of the feeder, but the slot reading cannot be performed properly in this kind of situations. For this reason it may be desirable to avoid the slot marker scanner.

To avoid installation of a slot marker scanner, a system for commercially available placement machines has been constructed where a detector counts the number of rotations of a spindle used to displace the slots in front of the component pick-up. This way, the actual count in the detector is associated with the actual slot. Simultaneously, the feeder marker is scanned in order to verify that the slot and the component in the feeder of that slot are in accordance with the associated device list. Such a system is commercially available from the company named Surpass Technologies Limited.

For this kind of counters, regular calibration is necessary, because drift in the mechanical system of the counter may lead to malfunction. Also, in case of electric failure, the counter needs calibration before being ready to operate. Conventional calibration of the control mechanism needs stopping of the operation of the complete machine and translation of the slot table to a position well defined for the counter. Stopping of the machine, however, is not desirable. This kind of system is not well suited for feeders, which have a non-centered pickup position.

SUMMARY OF THE INVENTION

It is the object of the invention to improve control systems for placement machines, in particular to provide a new system for component pick-up control where only one scanner, the feeder scanner, is necessary.

This object is achieved by a method of the type initially mentioned in which the determination of the actual slot ID is performed by determining the sequential step number of the actual step and reading the associated actual slot ID from the sequence list.

The method according to the invention relates to a placement machine, which for example may be used for production of electronic printed circuit boards as referred to in the following. However, the method is general and relates to other placement machines equally well.

It is noted for better understanding of the following that control methods and systems often are applied to already existing placement machines. From the placement machines, certain data, as sequence lists, may be read, but the placement machines generally work independent of the control systems, which usually are implemented as an additional tool for the user, for example the operator of the placement machine.

In the following, the term ID will be used as a short notation for identification means.

Such a placement machine has a series of feeder slots, which typically are mounted on a platform, for holding component feeders with corresponding feeder markers. Each feeder marker is associated with a component ID, indicative of the type of component contained in the corresponding feeder. Furthermore, each feeder slot has a slot ID. It is assumed that the placement machine operates in correlation with a repeated sequence list with sequential operating steps.

During operation of the machine, where the machine is in progress of picking a component from the actual feeder slot, the feeder marker from the actual feeder in the actual slot is scanned by an appropriate scanner. Typically such a feeder marker is a bar code, which is scanned by a bar code scanner. The trigger mechanism for the scanner to perform the scanning operation may be a sensor sensing the movement of the picking mechanism. As the feeder marker is associated to the component ID, scanning the feeder marker verifies the actual component ID. It should be pointed out that in the following, for simplification, the term feeder marker is used as a synonym for the actual feeder marker and the associated feeder ID that may occur in lists and other software applications.

In addition, the actual slot ID is determined. From stored configuration information, for example a so called device list which contains a listing of the slots and the components that are expected in the different slots, the intended component ID for the component expected in the actual slot is extracted.

The intended component ID refers to the expected component to be found in the actual slot according to stored configuration information, while the actual component ID refers to the component which actually is taken from the actual feeder in the actual slot. These two ID are compared, and in case of discrepancy between the intended component ID and the actual component ID, the discrepancy is indicated, for example by an alert to the operator of the machine.

The method according to the invention differs from prior art in the determination of the actual slot, which is explained in the following. It is known that the placement machine operates in accordance to a sequence list with sequential steps, where the sequence list is repeated from the beginning of the list each time the production of a new product, for example a printed circuit board, is begun, Therefore, while the placement machine is operating, the sequential step number of the actual step of operation of the placement machine may be determined. This can, for example, be achieved by reading a start signal, when a sequence starts, and counting the number of operational steps of the placement machine.

Having determined the sequential step, the slot ID is determined from the sequence list, as sequential step in this list is linked to the actual slot ID. Thus, the slot ID may be determined even without a position detector or a slot scanner, which is a new approach allowing to control a placement machine in a much simpler way. In addition, the system is also easy to implement in already existing placement machines. Furthermore, a system without a position detector or a slot scanner is much cheaper and does not suffer from the need of steady calibration or from a malfunctioning slot scanner, making the system also more safe. It also allows the use of feeders, which have a non centered pickup position.

The start signal to be read in the beginning of a new sequence may be achieved from the placement machine directly or by other means, for example from an appropriate sensor.

The counting of the steps from the beginning of the sequence list is possible, for example by reading of a trigger signal for each step. This trigger signal can, for example, be based on the movement of the picking mechanism.

In most cases, the above described counting of the steps and followed determining of the actual slot according to the sequence list works perfectly. However, in some cases, difficulties may arise, which is explained in the following. Some placement machines take into account that a component after pick up may be lost. In this case, a renewed pick up of the intended component may not be possible before the next component is picked up. The missed component may then be picked up at a later time which causes a deviation from the original sequence list and may lead to a false determination of the actual slot from the sequence list.

In a further embodiment of the invention, a solution has been found for this situation which is explained in the following. For this reason, an association is created between each actual feeder marker and the corresponding actual slot ID. For simplicity this association will be called a connection list, which is synonym for such a list and any other type of software association. Such a list is configured at each start of a sequence. Upon receipt of a pick up trigger signal for a sequential step, a control is performed, whether the actual feeder marker is already contained in this connection list.

If this is not the case, the feeder marker and associated slot ID, determined from the sequence list, is added to the connection list. This way, the connection list is updated for each sequential step. It has to be pointed out that in this case, the pick up cannot be a renewed pick up, because a renewed pick up would have implied access to the corresponding feeder at an earlier stage, which would result in the feeder marker having been added to the connection list already.

If the actual feeder marker on the other hand is found in the connection list, the corresponding slot ID from the connection list is compared with the actual slot ID as determined from the sequence list and, in case of disagreement, the actual pick up must be a renewed pick up. In this case, the counting of said trigger signal is avoided, because the step according to the sequence list has not yet been performed. For documentation reasons, an indication for such a renewed pick up may be stored together with time data and other data, for example the product serial number.

The method as described above may typically involve a computer for the control procedures and calculations and works without a slot position detector that indicates by position readings which actual slot a component is taken from. Avoiding such a detector cures some of the mistakes that may occur in the production process of placement machines. However, on the other hand, some other mistakes may occur, if the method as described above is used without a position detector. In other words, using a position detector to find the actual slot ID avoids some mistakes on a whole, while the method according to the invention may avoid other mistakes in the production process. In order to minimize the number of possible mistakes, a combination of a position detector and the above described method according to the invention is foreseen by the invention in the following still further embodiment.

According to this still further embodiment of the invention, it is assumed that a slot position detector is employed, from which detector signal is read, the detector signal being indicative of the position of the actual slot. Furthermore in accordance with such readings, an association is stored between each slot ID and a corresponding detector signal. For simplicity, this association will be called a position list being a synonym for such a list and any other form of this association. For each pick up, the detector signal is read and checked, whether said reading corresponds to a specific slot ID. If this is the case, the actual slot ID is determined from this reading, which is a conventional way for determining the actual slot ID. As the detector may be subject to drift, the reading value may be slightly different from earlier readings. This is foreseen in the invention, as the reading is accepted as being associated with a specific slot ID, if the read value is within a predetermined uncertainty interval. This interval is set large enough to accept slight drift of the detector, but small enough to assure, that the detector reading can be associated with a slot ID. However, if the value is outside this predetermined uncertainty interval, the slot ID may not be determined with certainty from the detector reading. In this case, the actual slot ID is determined from the sequence list with the method as described above and will be associated with the detector signal. Furthermore, the position list is edited correspondingly to contain the new association.

A problem may also occur if the position detector has been subject to a power failure. In this case, the reading of the detector may change for a specific slot such that the reading cannot be found in the position list. In this case, an initial calibration has to be performed. According to the invention, this problem has been foreseen and is cured by determining the actual slot ID from the sequence list by the method as described above after which the reading of the detector is associated with the determined actual slot in a new position list.

The association between a feeder marker and a specific component ID is achieved by scanning a specific feeder label of a specific feeder and scanning a component label indicative of the specific component type to be loaded into said specific feeder prior to installation of said specific feeder in the placement machine.

The invention may be used for printed electronic circuit boards but applies equally to any other product produced in such type of machine.

The invention will be explained in more detail in the following with reference to the drawings, where

DETAILED DESCRIPTION OF THE INVENTION

Figure 1:
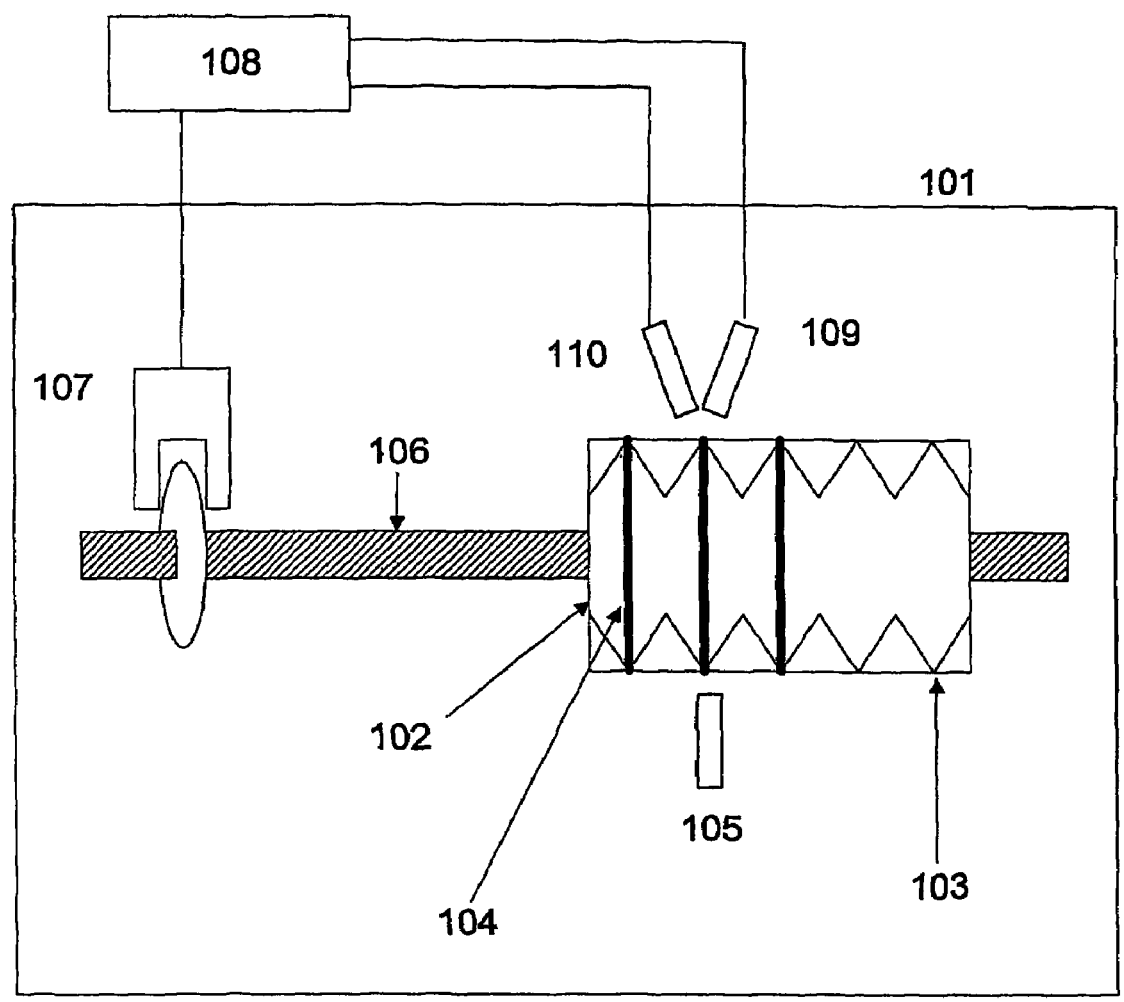
FIG. 1 is a diagram of a placement machine.

In FIG. 1, a placement machine 101 is illustrated having a platform 102, on which a number of slots 103 are located. Into each slot 103, a feeder 104 may be placed. Certain feeder 104 types may extend into several slots 103. The platform 102 is displaced relatively to the component pick up arm 105 for picking up components from different slots 103. Alternatively, the pick up arm 105 may be displaced with respect to the platform 102.

Each feeder 104 is provided with an identification marker, for example a bar code label, which is readable by an appropriate scanner 109. When the platform 102 is placed at a particular position to pick up a component from a specific slot 103, the feeder marker of the feeder 104 in the specific slot 103 is read and the reading transferred to the computer 108. The reading of the feeder marker is initiated by a pick up trigger signal, which may be due to a signal by a sensor 110, which senses the movement of the pick up arm 105 of the placement machine 101.

Figure 2:
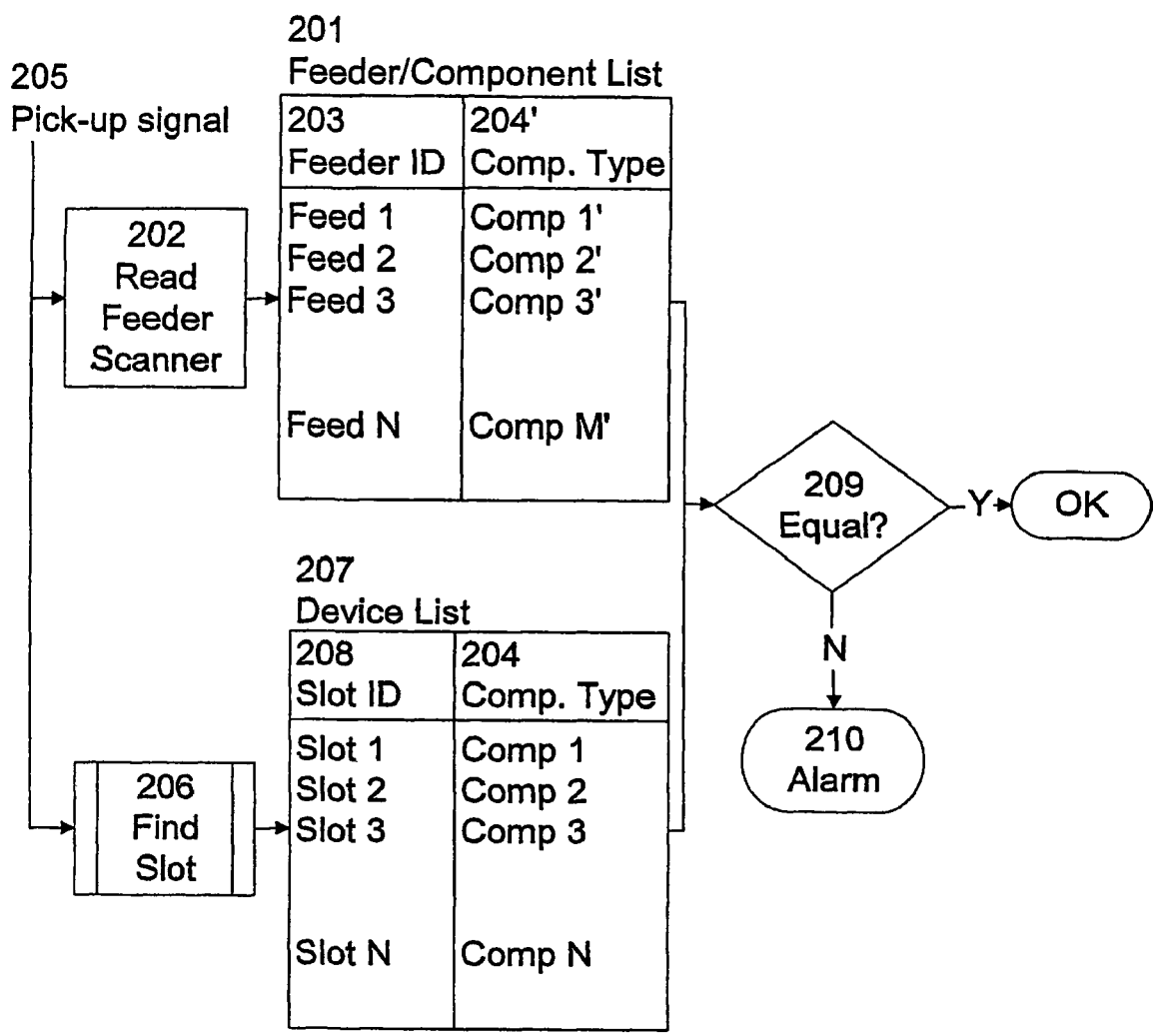
FIG. 2 is a diagram showing the principles for component control.

Normally, when component reels are loaded into a feeder 104, the feeder marker is read and stored together with the component ID of the component reel. Thus, the feeder marker of the actual feeder 104 in the actual slot 103, from which a component is to be taken, is associated to the component ID. The computer is configured to have access to these data, which is illustrated in FIG. 2 as a feeder/component list 201. Therefore, scanning 202 the feeder marker, which implicit is associated with a feeder ID 203, reveals the actual component type 204'. Scanning of the feeder marker is initiated by a pick up trigger signal 205 as described above. In connection with the same pick up, the actual slot ID 208 is determined by a routine operation 206. From stored configuration information, shown as device list 207, the intended component ID 204 of the type of component expected in this determined slot with actual slot ID 208 may be found. The control system aims for checking 209, whether the intended component 204 and the actual component 204' are identical. If a wrong actual component 204' has been picked up, this is indicated for example by an alert 210 to the operator.

Figure 3:
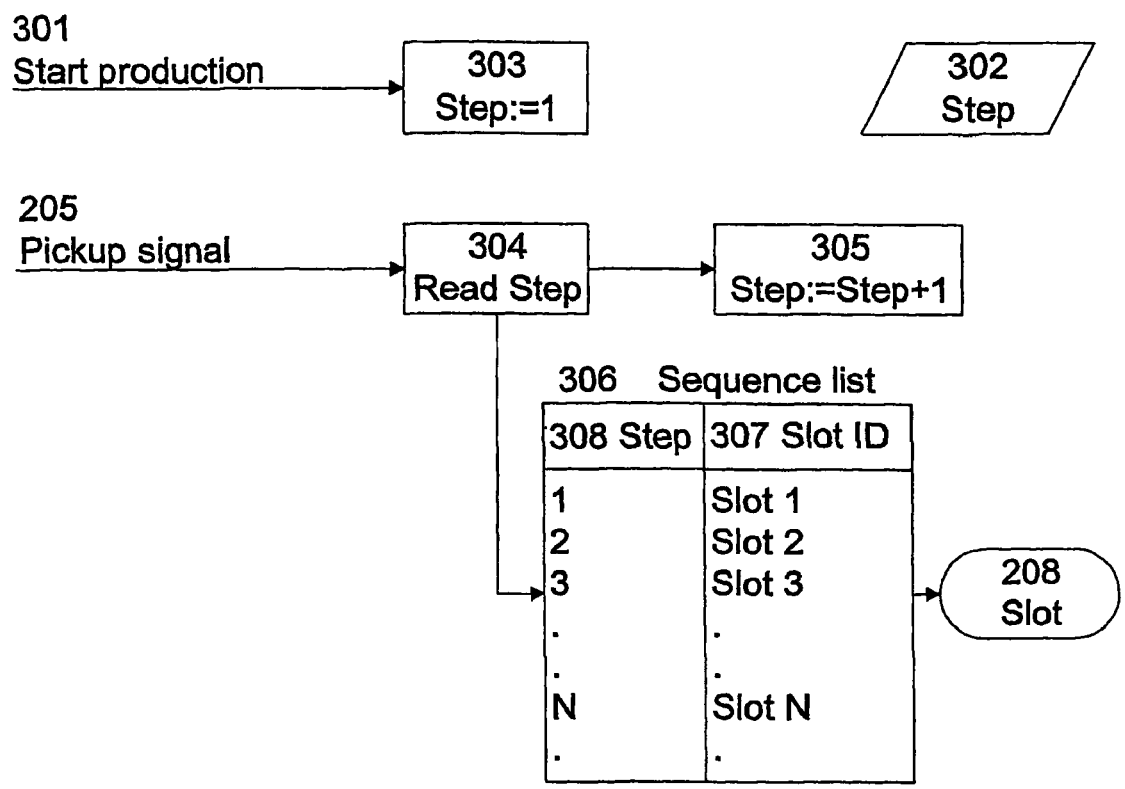
FIG. 3 is a diagram showing the principles for determining the slot ID according to the invention.

In FIG. 3, an embodiment is shown for the routine operation 206 to determine the actual slot ID. When the placement machine starts the production of a new product, the sequence list is at the beginning and a sequence start signal 301 is read. In order to count the number of sequential steps, a step counter routine 302 may be employed with a counting mechanism. As a response to the start signal 301, the counter is reset 303 to the step value 1. At the receipt of each trigger pick up signal 205, the step count is read 304 and advanced 305 one step. From the sequence list 306 the actual slot ID 208 corresponding to the actual step 308 is determined, which then, as shown in FIG. 2, is used to determine the intended component type 204 from the device list 207.

This method can thus be used to determine the actual slot ID 208 without the need of a position detector. However, in case that the placement machine 101 looses a component after pick up and then performs a renewed pick up at a later stage, this method does not function properly.

Figure 4:
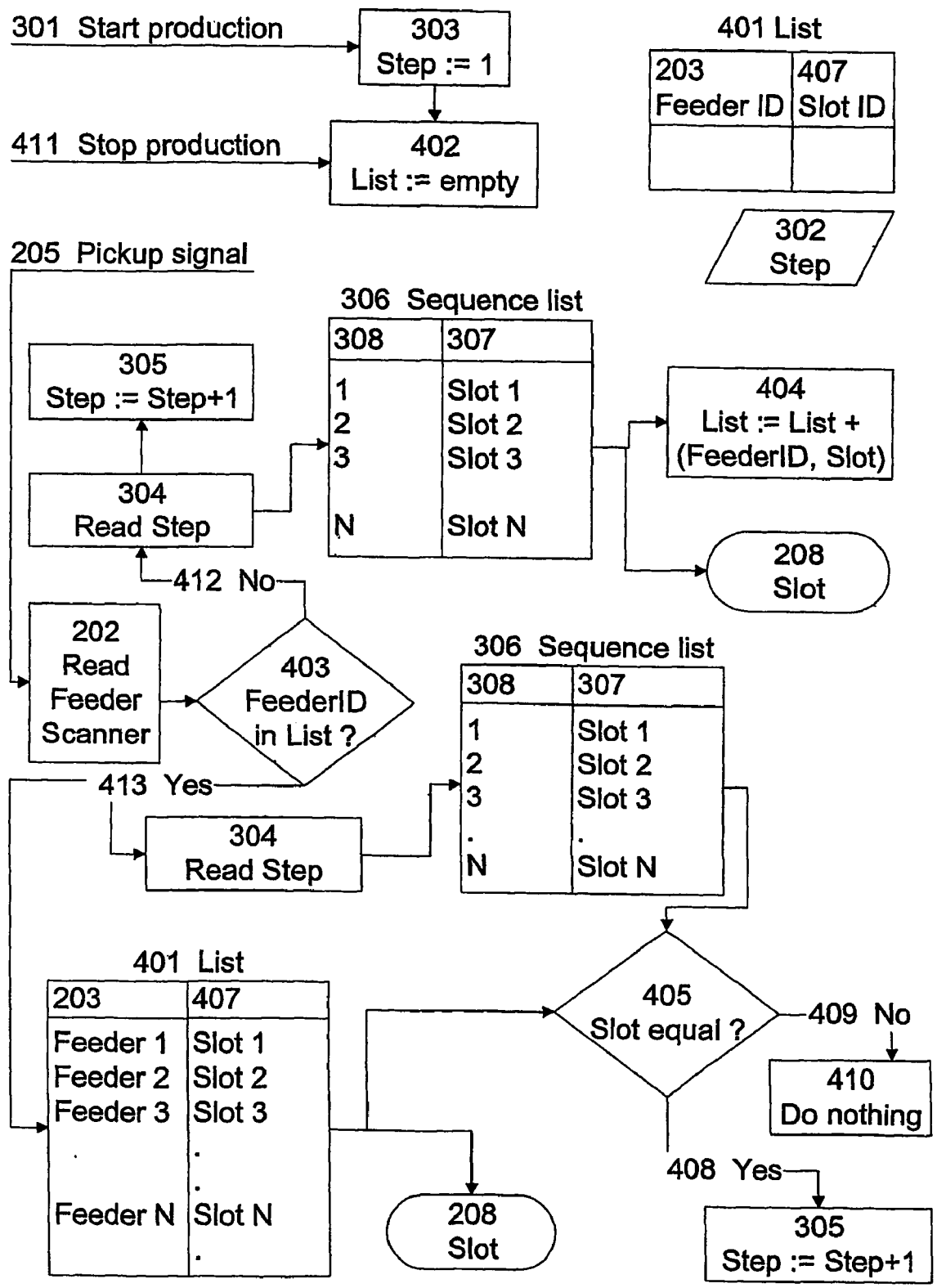
FIG. 4 is a diagram showing the principles for component control taking into account renewed pick ups.

The problem with renewed pick ups is solved by the alternative embodiment of the routine 206 as illustrated in the diagram of FIG. 4 and explained in the following. This embodiment employs a step counter 302 in the same way as just mentioned and a connection list 401, where a feeder ID 203 is associated with a corresponding slot ID 407 as determined.

At a response to the start signal 301, the step counter is reset 303 and the connection list 401 is cleared 402. For each trigger signal 205, the scanner is read 202, and a routine 403 checks, whether, the scanned feeder marker with associated feeder ID 203 can be found in the connection list 401.

If this is not the case 412, the step number is read 304 and advanced 305. From the sequence list 306 the actual slot 307 corresponding to the step 308 is determined. The new feeder/slot combination is added 404 to the connection list 401, and the actual slot 307 is used as the result for the determined slot ID 208 to be used to find the intended component 204 from the device list 207 as illustrated in FIG. 2.

If the feeder ID associated with the scanned feeder marker on the other hand is in the connection list 413, the corresponding slot ID 407 from the connection list 401 is compared by a routine 405 with the actual slot ID 307 as found from the sequence list 306. If these two ID 307, 407 are identical 408, a type of component has been picked up which is equal to a type of component that has been picked up at an earlier stage. The feeder/slot combination is already stored in the connection list, which therefore need not be edited. For the next sequential step, the step counter 302 is advanced 305 one step. However, if these two slot ID 307, 407 are not identical 409, the pick up has been a renewed pick up 410 of an earlier lost component. In this case, the counter 302 is not advanced. The actual slot ID 208 to be used in connection with the component control as illustrated in FIG. 2 is determined from the connection list 401, as the reading 202 of the feeder marker with associated feeder ID 203 results in the actual slot ID 407 from the connection list 401.

In case that a feeder 104 runs out of components, the placement machine 101 may stop automatically. The feeder 104 will then typically be changed with another feeder at hand containing this type of component. After this exchange, which may be done by the operator, the feeder/slot combination may be different than stored in the connection list, because it is possible to move feeders, when the machine is stopped. Therefore, each time the production with the placement machine 101 is stopped, and a corresponding stop signal is received 411, the connection list 401 is cleared 402.

The method as described may typically involve a computer for the control procedures and calculations and works without a slot position detector. However, some mistakes may occur, if the method as described above is used without a position detector. Therefore, a combination of a position detector and the above described method according to the invention is preferred.

An example of when the method according to the invention results in malfunction is given in the following. If a feeder 104 runs out of components, the placement machine 101 is stopped and the feeder 104 may be changed with a new feeder holding the same component type. In this case for above reasons, the connection list 401 is cleared. That means however that a renewed pick up during the remaining sequence is not detected and results in an alarm 210 to the operator, as illustrated in FIG. 2, because the determined slot ID 307 from the sequence list 306, as shown in the upper part of FIG. 4, leads to an intended component ID 204, as illustrated n FIG. 2, which is different from the renewed pick up component 204'.

This situation is rare, but is one of the faults that may occur and delay the production process with increased production cost as a result. In order to avoid these type of faults, a related error message may be received from the placement machine 101 and used in connection with the invention to take into account this type of pick up. However not always, placement machines 101 may make such an error message available. Also, the operator may choose to skip this component and place the mount of the component in another stage in the production process. In these cases, the above described embodiments of the invention do not work properly. Therefore, it is foreseen in this invention that a position detector may be employed in addition to the method according to the invention.

It may be questioned, whether the method according to the invention is useful if a detector is used anyhow. However, the method according to the invention is necessary, for example if the identification of the actual slot by the detector does not function properly, which may be the case when the detector has been subject to a power failure, when the position detector changes its reading due to calibration drift, or when a feeder with an off-centered pickup position is used.

In the following, it is assumed, that a position detector is employed in connection with the control system of the placement machine, for example as illustrated in FIG. 1. The platform 102 is displaced linearly along a spindle 106 due to rotation of the spindle. A detector 107 with an encoder translates the rotation of the spindle 106 into data indicative of a longitudinal position of the platform 102 relative to a reference point. In the detector 107 or in the connected computer 108, for example a personal computer, the position may be calculated from these data.

Figure 5:
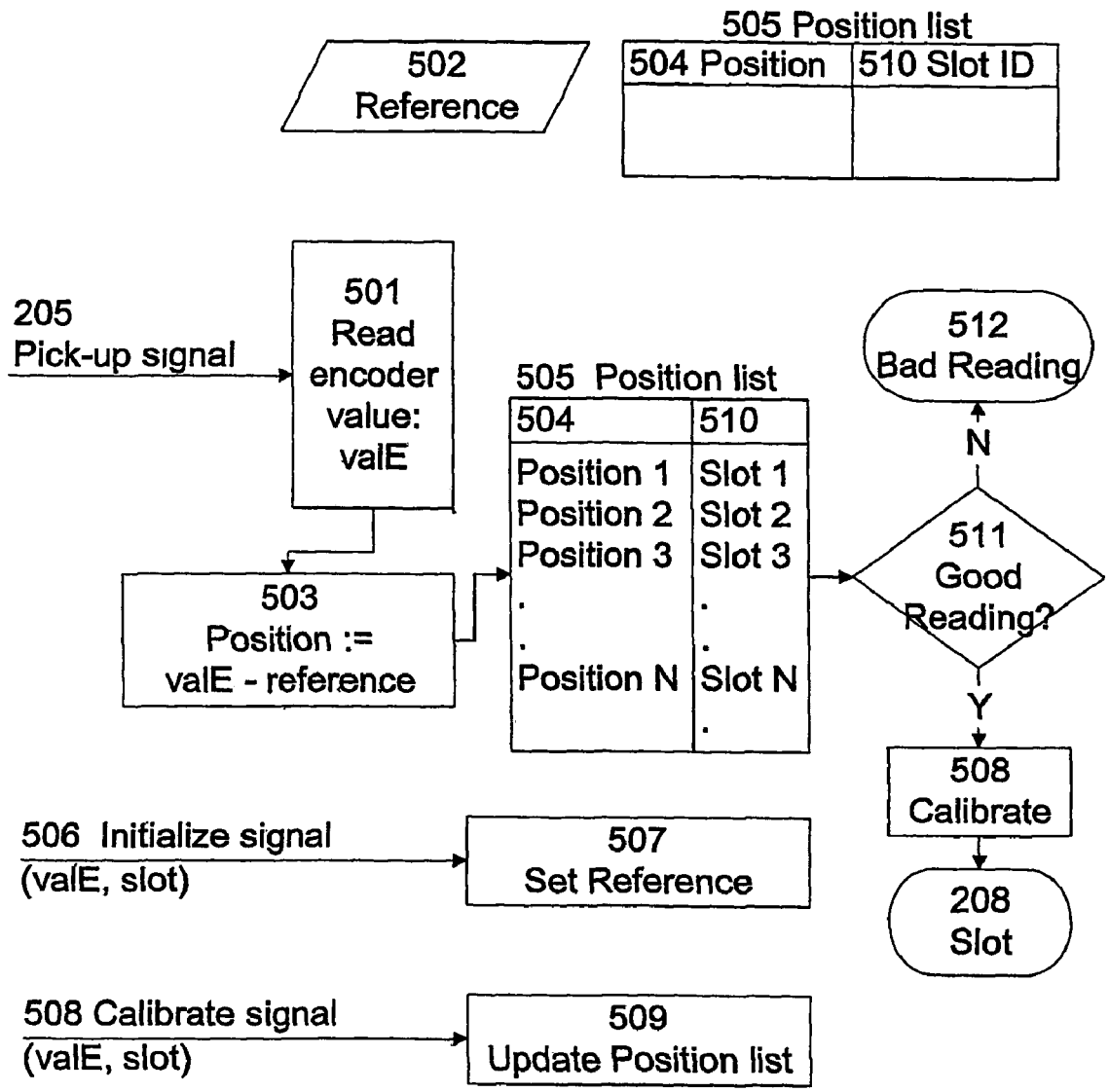
FIG. 5 is a diagram configuration of the position list.

In this case, the slot ID 208 may be determined as illustrated in FIG. 5. As a response to a pick up trigger signal 205, the encoder value is read 501. Usually, this value is offset from a reference position, which is illustrated by the reference value 502, which is stored for calculation 503 of the position. For each slot 103, the signal, valE, from the encoder is read and the position 504, or any data indicative of the position, for each slot is stored in the position list 505 in association with the corresponding slot ID 510.

The detector 107 may be initialized by an initializing signal 506 in order to set the reference value 507. Also, in response to a calibration signal 508, the position list 505 may be updated 509.

Once this position list 505 has been established, it may be used to extract the slot ID 510 corresponding to the position 504 as read from the detector 107 and the determined slot ID 510 from the position list is used as the slot ID 208 for the component verification procedure as illustrated in FIG. 2.

Figure 6:
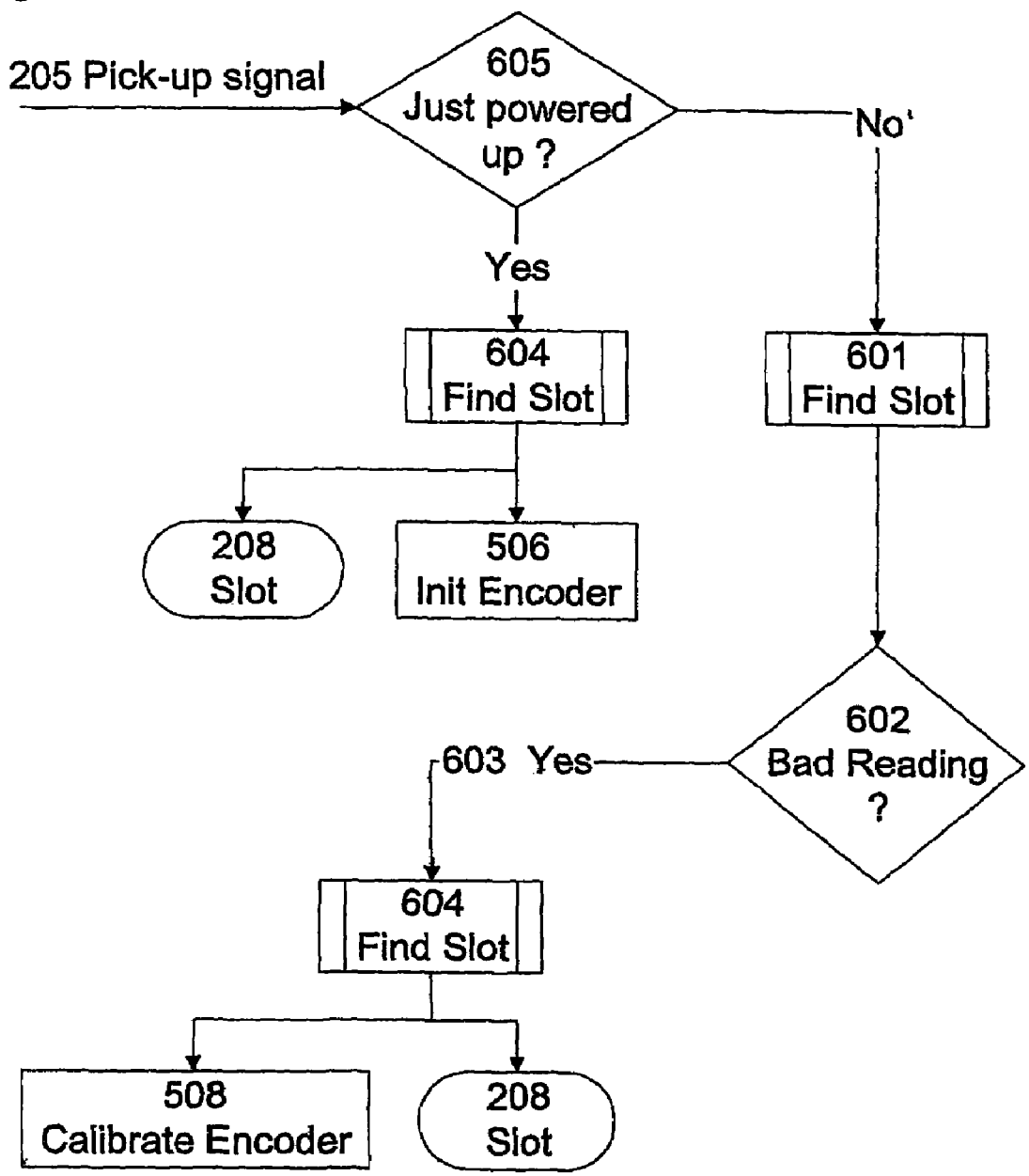
FIG. 6 is a diagram showing the principle for calibration of the position detector.

As the detector 107 may be subject to drift, the reading value may be slightly different from earlier readings. This is foreseen in the invention in a procedure 511, as the position 504 reading is accepted as being a good reading and associated with a specific slot ID 510, if the read value is within a predetermined uncertainty interval. This interval is set large enough to accept slight drift of the detector 107, but small enough to assure, that the detector reading can be associated with a slot ID. If the read value differs slightly from earlier readings but are still within the acceptable limits of the predetermined uncertainty interval, the position list is updated in a calibration procedure 508. The determination of the slot ID 208 as illustrated in FIG. 5 is illustrated in FIG. 6 as procedure 601.

However, if the position value is outside this predetermined uncertainty interval, the slot ID may not be determined with certainty from the detector reading and the reading is deemed a bad reading 512 as illustrated in FIG. 5. As a consequence of this bad reading 512, which is checked for in routine 602, the actual slot ID 208 to be used for the component verification as illustrated in FIG. 2 is determined 604 from the sequence list 306 with the method as described above and illustrated in FIG. 4. The determined slot ID 208 in this case is used for a calibration 508 of the detector 107

A problem may also occur, if the position detector 107 has been subject to a power failure. In this case, the reading of the detector 107 may change for a specific slot 103 such that the reading cannot be found in the position list 505. Therefore after receipt of each trigger signal 205, it is checked 605, whether the position detector 107 has just been powered up after the power failure. In this case, an initial calibration 506 has to be performed. According to the invention, this problem has been foreseen and is cured by determining the actual slot ID 208 from the sequence list by the method 604 as described above and illustrated in FIG. 4. In the initialization process 506 the reference position reading is associated with the determined actual slot ID 208 which constitutes a basis for the configuration of the reference position 507.

As explained above, the invention may be applied in control systems for placement machines without the use of a position detector which may be an advantage in case that a minimum of hardware is preferred. On the other hand, the invention may be applied in connection with a position detector, where the invention takes into account malfunction of a detector and therefore minimizes the risk for production errors.

What is claimed is:

1. Method for component verification during operation of a placement machine (101) having a series of feeder slots (103) for holding component feeders (104) with feeder markers, each feeder marker associated with a component ID (204') indicative of the type of component contained in the corresponding feeder (203), wherein each feeder slot (103) has a slot ID (208), wherein said placement machine operates in correlation with a repeated sequence list (306) with sequential steps, said method comprising upon receipt of a pick up trigger signal (205) scanning a feeder marker from the actual feeder (104) in said actual feeder slot (103), while the machine (101) is in progress of picking a component from said actual feeder (104), to determine the actual component ID (204') associated with the feeder marker, determining (206) the actual slot ID (208), determining from stored configuration information (207) the intended component ID (204), where the intended component ID (204) is the ID of the type of component intended to be picked up from said actual feeder slot (104), comparing said intended component ID (204) with said actual component ID (204'), in case of discrepancy between said intended component ID (204) and said actual component ID (204') indicating said discrepancy, wherein determining (206) said actual slot ID (208) comprises determining the sequential step number of the actual step (308) and for each actual step during operation of said placement machine, reading from said sequence list (306) the associated actual slot ID (208); and using the actual slot ID (208) read out from the sequence list (306) to determine the intended component ID (204) for comparison with said actual component ID (204').

2. Method according to claim 1, wherein said determining said sequential number comprises, at the start of a sequence, reading a sequence start signal (301) and counting said pick up trigger signals (305).

3. Method according claim 2, wherein said method further comprises configuring a connection list (401) for associating the actual feeder marker (203) with the determined actual slot ID (407), upon receipt of said pick up trigger signal checking whether said actual feeder marker (203) is contained in said connection list (401)

if this is not the case, adding said feeder marker (203) and associated determined slot ID (407) to said connection list, if this is the case, comparing the corresponding slot ID (407) from the connection list with the actual slot ID (307) as determined from the sequence list (306), and in case of disagreement, avoiding (410) of said counting (305) of said trigger signal (205).

4. Method according to claim 3, wherein said avoiding (410) of said counting said trigger signal (205) further implies storing an indication for a renewed pick up.

5. Method according to claim 4, wherein said method involves reading (501) of a detector signal (504) from a slot position detector (107), configuring a position list (505) for associating a detector signal (504) with each slot ID (510), checking (511) for each further reading of a detector signal (504) whether said reading within a predetermined uncertainty interval is contained in said position list (505), and if this is not the case (603), editing (508) said position list (505) and associating (508) said detector signal (504) with said determined (604) slot ID (208) from said sequence list (306).

6. Method according to claim 1, wherein said pick up trigger signal (205) comprises a signal from a sensor (110) sensing the movement of the picking mechanism of the placement machine (101).

7. Method according to claim 1, wherein said method involves reading (501) of an actual detector signal from a slot position detector (107), and in case that said slot position detector (107) has just started operation after a power failure (605) associating said actual detector signal with said determined (604) actual slot ID (208).

8. Method according to claim 1, wherein said step of indicating said discrepancy comprises alerting (210) an operator.

9. Method according to claim 1, wherein said association (201) between a feeder marker (203) and a specific component ID (204') is achieved by scanning a specific feeder marker (203) of a specific feeder (104) and scanning a component label indicative of the specific component type (204') to be loaded into said specific feeder (104) prior to installation of said specific feeder (104) in the placement machine (101).

10. Method of controlling a placement machine (101) for production of printed electronic circuits, having a series of feeder slots (103) for holding component feeders (104) with feeder markers, each feeder marker associated with a component ID (204') indicative of the type of component contained in the corresponding feeder (203), wherein each feeder slot (103) has a slot ID (208), wherein said placement machine operates in correlation with a repeated sequence list (306) with sequential steps, comprising the steps of:

upon receipt of a pick up trigger signal (205), scanning a feeder marker from the actual feeder (104) in said actual feeder slot (103), while the machine (101) is in progress of picking a printed electronic circuit from said actual feeder (104), to determine the actual component ID (204') associated with the feeder marker, determining (206) the actual slot ID (208), determining from stored configuration information (207) the intended component ID (204), where the intended component ID (204) is the ID of the type of component intended to be picked up from said actual feeder slot (104), comparing said intended component ID (204) with said actual component ID (204'), in case of discrepancy between said intended component ID (204) and said actual component ID (204') indicating said discrepancy, wherein determining (206) said actual slot ID (208) comprises determining the sequential step number of the actual step (308) and reading from said sequence list (306) the associated actual slot ID.

11. Method for component verification during operation of a placement machine (101) having a series of feeder slots (103) for holding component feeders (104) with feeder markers, each feeder marker associated with a component ID (204') indicative of the type of component contained in the corresponding feeder (203), wherein each feeder slot (103) has a slot ID (208), wherein said placement machine operates in correlation with a repeated sequence list (306) with sequential steps, said method comprising upon receipt of a pick up trigger signal (205) scanning a feeder marker from the actual feeder (104) in said actual feeder slot (103), while the machine (101) is in progress of picking a component from said actual feeder (104), to determine the actual component ID (204') associated with the feeder marker, determining (206) the actual slot ID (208), determining from stored configuration information (207) the intended component ID (204), where the intended component ID (204) is the ID of the type of component intended to be picked up from said actual feeder slot (104), comparing said intended component ID (204) with said actual component ID (204'), in case of discrepancy between said intended component ID (204) and said actual component ID (204') indicating said discrepancy, wherein the determining (206) of said actual slot ID (208) comprises:

determining the sequential step number of the actual step (308) and reading from said sequence list (306) the associated actual slot ID (208), configuring a connection list (401) for associating the actual feeder marker (203) with the determined actual slot ID (407), upon receipt of said pick up trigger signal checking whether said actual feeder marker (203) is contained in said connection list (401)

if this is not the case, adding said feeder marker (203) and associated determined slot ID (407) to said connection list, if this is the case, comparing the corresponding slot ID (407) from the connection list with the actual slot ID (307) as determined from the sequence list (306), and in case of disagreement, avoiding (410) of said counting (305) of said trigger signal (205).

12. Method according to claim 11, wherein said determining said sequential number comprises at the start of a sequence reading a sequence start signal (301) and counting said pick up trigger signals (305).

13. Method according to claim 11, wherein said pick up trigger signal (205) comprises a signal from a sensor (110) sensing the movement of the picking mechanism of the placement machine (101).

14. Method according to claim 11, wherein said avoiding (410) of said counting said trigger signal (205) further implies storing an indication for a renewed pick up.

15. Method according to claim 11, wherein said method involves reading (501) of a detector signal (504) from a slot position detector (107), configuring a position list (505) for associating a detector signal (504) with each slot ID (510), checking (511) for each further reading of a detector signal (504) whether said reading within a predetermined uncertainty interval is contained in said position list (505), and if this is not the case (603), editing (508) said position list (505) and associating (508) said detector signal (504) with said determined (604) slot ID (208) from said sequence list (306).

16. Method according to claim 11, wherein said method involves reading (501) of an actual detector signal from a slot position detector (107), and in case that said slot position detector (107) has just started operation after a power failure (605) associating said actual detector signal with said determined (604) actual slot ID (208).

17. Method according to claim 11, wherein said association (201) between a feeder marker (203) and a specific component ID (204') is achieved by scanning a specific feeder marker (203) of a specific feeder (104) and scanning a component label indicative of the specific component type (204') to be loaded into said specific feeder (104) prior to installation of said specific feeder (104) in the placement machine (101).

18. Method for component verification during operation of a placement machine (101) having a series of feeder slots (103) for holding component feeders (104) with feeder markers, each feeder marker associated with a component ID (204') indicative of the type of component contained in the corresponding feeder (203), wherein each feeder slot (103) has a slot ID (208), wherein said placement machine operates in correlation with a repeated sequence list (306) with sequential steps, said method comprising upon receipt of a pick up trigger signal (205) scanning a feeder marker from the actual feeder (104) in said actual feeder slot (103), while the machine (101) is in progress of picking a component from said actual feeder (104), to determine the actual component ID (204') associated with the feeder marker, determining (206) the actual slot ID (208), determining from stored configuration information (207) the intended component ID (204), where the intended component ID (204) is the ID of the type of component intended to be picked up from said actual feeder slot (104), comparing said intended component ID (204) with said actual component ID (204'), in case of discrepancy between said intended component ID (204) and said actual component ID (204') indicating said discrepancy, wherein the determining (206) of said actual slot ID (208) comprises:

determining the sequential step number of the actual step (308) and reading from said sequence list (306) the associated actual slot ID (208), reading (501) of a detector signal (504) from a slot position detector (107), configuring a position list (505) for associating a detector signal (504) with each slot ID (510), checking (511) for each further reading of a detector signal (504) whether said reading within a predetermined uncertainty interval is contained in said position list (505), and if this is not the case (603), editing (508) said position list (505) and associating (508) said detector signal (504) with said determined (604) slot ID (208) from said sequence list (306).

19. Method according to claim 18, wherein said determining said sequential number comprises at the start of a sequence reading a sequence start signal (301) and counting said pick up trigger signals (305).

20. Method according to claim 19, wherein said association (201) between a feeder marker (203) and a specific component ID (204') is achieved by scanning a specific feeder marker (203) of a specific feeder (104) and scanning a component label indicative of the specific component type (204') to be loaded into said specific feeder (104) prior to installation of said specific feeder (104) in the placement machine (101).

21. Method according to claim 18, wherein said pick up trigger signal (205) comprises a signal from a sensor (110) sensing the movement of the picking mechanism of the placement machine (101).

22. Method according to claim 18, wherein said method involves reading (501) of an actual detector signal from a slot position detector (107), and in case that said slot position detector (107) has just started operation after a power failure (605) associating said actual detector signal with said determined (604) actual slot ID (208).

* * * * *